(12) United States Patent
Yoshida et al.

(10) Patent No.: US 6,624,714 B2
(45) Date of Patent: Sep. 23, 2003

(54) RADIATOR CAPABLE OF CONSIDERABLY SUPPRESSING A HIGH-FREQUENCY CURRENT FLOWING IN AN ELECTRIC COMPONENT

(75) Inventors: Shigeyoshi Yoshida, Abiko (JP); Yoshio Awakura, Yokohama (JP); Hiroshi Ono, Yokohama (JP)

(73) Assignee: NEC Tokin Corporation, Miyagi (JP)

( * ) Notice: Subject to any disclaimer, the term of this patent is extended or adjusted under 35 U.S.C. 154(b) by 0 days.

(21) Appl. No.: 09/824,935

(22) Filed: Apr. 3, 2001

(65) Prior Publication Data

US 2001/0040790 A1 Nov. 15, 2001

(30) Foreign Application Priority Data

Apr. 5, 2000 (JP) ........................... 2000-103171

(51) Int. Cl.[7] .............................. H05K 7/20; H05K 9/00
(52) U.S. Cl. ........................ 333/12; 257/753; 361/709
(58) Field of Search .......................... 333/12; 361/816, 361/818, 709; 257/684, 686, 753

(56) References Cited

U.S. PATENT DOCUMENTS

| | | | |
|---|---|---|---|
| 5,164,683 A | 11/1992 | Shields | |
| 5,291,064 A | * 3/1994 | Kurokawa | 257/714 |
| 5,303,113 A | 4/1994 | Goleman | |
| 5,956,576 A | * 9/1999 | Toy et al. | 438/125 |
| 6,255,737 B1 | * 7/2001 | Hashimoto | 257/784 |

OTHER PUBLICATIONS

European search report, Jul. 13, 2001.

* cited by examiner

*Primary Examiner*—Robert Pascal
*Assistant Examiner*—Dean Takaoka
(74) *Attorney, Agent, or Firm*—Bradley Ruben, PL (57) ABSTRACT

In a radiator (1) for use in radiating heat generated by an electronic component (5), a high-frequency current suppressor (2) is attached to that principal surface of the radiator which faces the electronic component. The high-frequency current suppressor serves to attenuate a high-frequency current flowing through the radiator and having a frequency within a frequency band between several tens MHz and several GHz. It is preferable that a heat-conductive sheet is formed on the high-frequency current suppressor. An insulating sheet may be formed on the high-frequency current suppressor.

21 Claims, 6 Drawing Sheets

RADIATOR CAPABLE OF CONSIDERABLY SUPPRESSING A HIGH-FREQUENCY CURRENT FLOWING IN AN ELECTRIC COMPONENT

BACKGROUND OF THE INVENTION

This invention relates to a radiator which is for radiating heat generated by an electronic component upon energization to prevent an increase in temperature of the electronic component and which is attached to the electronic component itself or to a circuit board or a housing with the electronic component mounted thereon.

In the field of electronic communication, use is made of electronic apparatuses and data processing apparatuses with various electronic components mounted thereon. These electronic components are generally mounted on a circuit board provided with a conductive pattern.

These electronic components may be various semiconductor active devices including a random access memory (RAM), a read-only memory (ROM), a microprocessor (MPU), a central processing unit (CPU), and an image processor arithmetic logic unit (IPALU). Generally, these semiconductor active devices are used at a high frequency and operated at a high speed. To this end, the semiconductor active devices are highly integrated in accordance with a circuit layout and provided with a plurality of terminals (generally called a lead frame) for use in signal processing to be formed into a chip of a semiconductor integrated circuit device (IC) or a semiconductor large-scale integrated circuit device (LSI).

The semiconductor active device of the type described has an operation speed and a signal processing speed each of which is very high. In order to perform a high-speed operation with a further integrated structure, the device is designed to be used at a high frequency in a frequency band between several tens MHz and several GHz. Accordingly, a radiator attached to the semiconductor active device is required to be further improved in radiation efficiency.

In the meanwhile, if such a high frequency within the frequency band between several tens MHz and several GHz is used at the semiconductor active device, a high-frequency (harmonic) current flows through the terminals of the semiconductor active device and the radiator itself. The high-frequency current may be conducted to other electronic components, signal paths including the terminals, or apparatuses and devices with the electric/electronic components mounted thereon. The high-frequency current becomes a factor of causing electromagnetic interference which adversely affects the operation of the electronic components to result in an operation error or which deteriorates basic functions of the electronic components. Therefore, such high-frequency current must be removed or suppressed.

In existing electronic components or radiators, however, consideration is not sufficiently made of the countermeasure against the high-frequency current. Therefore, it is difficult to prevent the occurrence of the electromagnetic interference resulting from the high frequency current.

SUMMARY OF THE INVENTION

It is therefore an object of this invention to provide a radiator of a high-frequency current suppressing type which is capable of sufficiently and considerably suppressing a high-frequency current to prevent occurrence of electromagnetic interference even if an electronic component is used at a high frequency within a frequency band between several tens MHz and several GHz.

Other objects of the present invention will become clear as the description proceeds.

According to an aspect of the present invention, there is provided a radiator for use in radiating heat generated by an electronic component, the radiator having a principal surface facing the electronic component, the radiator comprising a high-frequency current suppressor attached to the principal surface for attenuating a high-frequency current flowing through the radiator and having a frequency within a frequency band between several tens MHz and several GHz.

According to another aspect of the present invention, there is provided a radiator for use in radiating heat generated by an electronic component, the radiator having a principal surface facing the electronic component, the radiator comprising a high-frequency current suppressor attached to the principal surface for attenuating a high-frequency current flowing through the radiator and having a frequency within a frequency band between several tens MHz and several GHz and a heat-conductive sheet excellent in heat conductivity and formed on the high-frequency current suppressor.

According to still another aspect of the present invention, there is provided a radiator for use in radiating heat generated by an electronic component, the radiator having a principal surface facing the electronic component, the radiator comprising a high-frequency current suppressor attached to the principal surface for attenuating a high-frequency current flowing through the radiator and having a frequency within a frequency band between several tens MHz and several GHz and an insulating sheet excellent in electrical insulation and formed on the high-frequency current suppressor.

According to yet another aspect of the present invention, there is provided a radiator for use in radiating heat generated by an electronic component, the radiator having a principal surface facing the electronic component, the radiator comprising a high-frequency current suppressor attached to the principal surface for attenuating a high-frequency current flowing through the radiator and having a frequency within a frequency band between several tens MHz and several GHz, the high-frequency current suppressor being made of a magnetic substance of a magnetic composition comprising M, X and Y, where M is a metallic magnetic material consisting of Fe, Co, and/or Ni, X being element or elements other than M and Y, and Y being F, N, and/or O, the M—X—Y magnetic composition having a concentration of M in the composition so that the M—X—Y magnetic composition has a saturation magnetization of 35–80% of that of the metallic bulk of magnetic material comprising M alone, the magnetic composition having the maximum value $\mu''_{max}$ of an imaginary part $\mu''$ of relative permeability in a frequency range of 0.1–10 gigahertz (GHz).

DESCRIPTION OF THE PREFERRED EMBODIMENTS

Figure 1A:
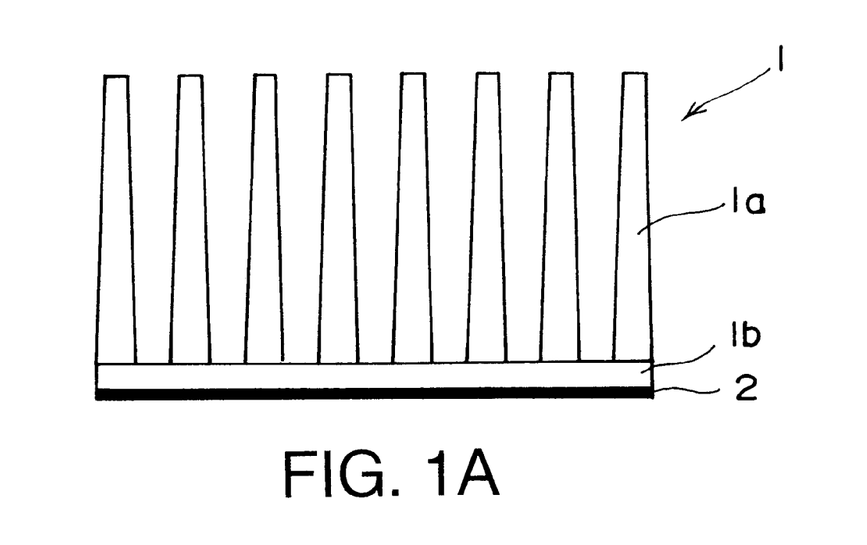
FIG. 1A is a side view of a radiator of a high-frequency current suppressing type according to a first embodiment of this invention.

Referring to FIG. 1A, description will be made of a radiator of a high-frequency current suppressing type according to a first embodiment of this invention.

The radiator 1 illustrated in FIG. 1A comprises a plurality of fins 1a arranged at a predetermined space from one another, a base plate 1b having a principal surface or an upper surface fixed to one ends of the fins 1a, and a high-frequency current suppressor 2 in the form of a film formed on an opposite surface or a lower surface of the base plate 1b.

Figure 1B:
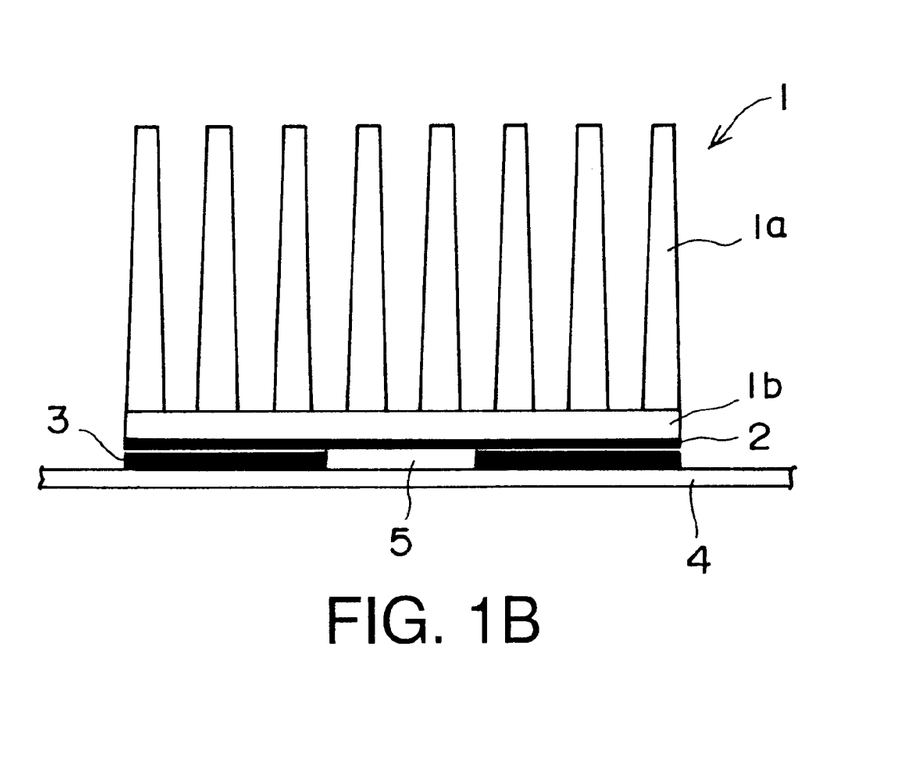
FIG. 1B is a side view showing the radiator illustrated in FIG. 1A in a state where it is mounted on a circuit board.

Referring to FIG. 1B, the radiator 1 in FIG. 1 is mounted on a printed circuit board 4. The printed circuit board 4 has a principal surface or an upper surface with a semiconductor integrated circuit device 5 mounted thereon as an electronic component. Around the semiconductor integrated circuit device 5, a high-frequency current suppressor 3 is formed as a film. The radiator 1 is mounted on the circuit board 4 so that the high-frequency current suppressor 2 is brought into contact with the semiconductor integrated circuit device 5 and the high-frequency current suppressor 3. As a result, the radiator 1 is attached to the printed circuit board 4 with the upper surface and the peripheral surface of the semiconductor integrated circuit device 5 covered with the high-frequency current suppressors 2 and 3.

The high-frequency current suppressor 2 is adhered to each of the semiconductor integrated circuit device 5 and the high-frequency current suppressor 3 by the use of an adhesive or a double-sided adhesive tape. Each of the high-frequency current suppressors 2 and 3 is a thin-film magnetic substance and exhibits the conductivity within a frequency range smaller than several tens MHz.

With this structure, even if the semiconductor integrated circuit device 5 is used at a high frequency in a frequency band between several tens MHz and several GHz, the high-frequency current suppressors 2 and 3 sufficiently and considerably attenuate the high-frequency current flowing through terminals of the semiconductor integrated circuit device 5 and through the radiator 1 itself. Therefore, it is possible to prevent occurrence of electromagnetic interference and to remove an adverse affect of the electromagnetic interference. Thus, a combination of the high-frequency current suppressors 2 and 3 serves to attenuate the high-frequency current flowing through the radiator 1 itself and having the frequency within the frequency band between several tens MHz and several GHz.

Figure 2:
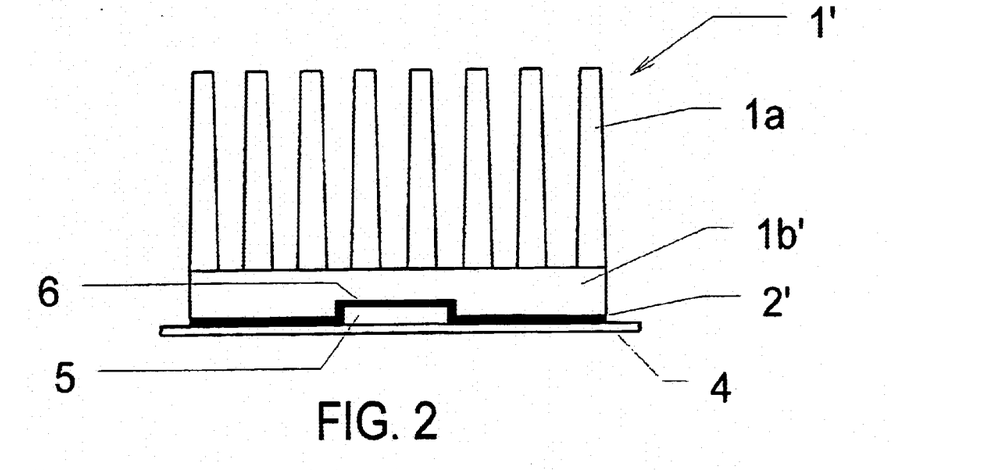
FIG. 2 is a side view of a radiator of a high-frequency current suppressing type according to a second embodiment of this invention in a state where it is mounted on a circuit board.

Referring to FIG. 2, description will be made of a radiator of a high-frequency current suppressing type according to a second embodiment of this invention. Similar parts are designated by like reference numerals and will not be described any longer.

In the radiator 1 illustrated in FIG. 2, the base plate 1b is provided with a recessed portion 6 formed on its lower surface to receive the semiconductor integrated circuit device 5. On the lower surface of the base plate 1b including the recessed portion 6, the high-frequency current suppressor 2 is formed as a film. When the radiator 1 is attached to the circuit board 4, the recessed portion 6 is faced to the semiconductor integrated circuit device 5. As a result, the upper surface and the peripheral surface of the semiconductor integrated circuit device 5 are covered with the high-frequency current suppressor 2 alone. Therefore, no high-frequency current suppressor is required to be formed on the circuit board 4.

The high-frequency current suppressor 2 is adhered to each of the semiconductor integrated circuit device 5 and the circuit board 4 by the use of an adhesive or a double-sided adhesive tape.

With this structure, even if the semiconductor integrated circuit device 5 is used at the high frequency within the frequency band between several tens MHz and several GHz, the high-frequency current suppressor 2 sufficiently and considerably attenuates the high-frequency current flowing through the terminals of the semiconductor integrated circuit device 5 and through the radiator 1 itself. Therefore, it is possible to prevent occurrence of electromagnetic interference and to remove an adverse affect of the electromagnetic interference. Thus, the high-frequency current suppressor 2 alone serves to attenuate the high-frequency current flowing through the radiator 1 itself and having the frequency within the frequency band between several tens MHz and several GHz.

Figure 3:
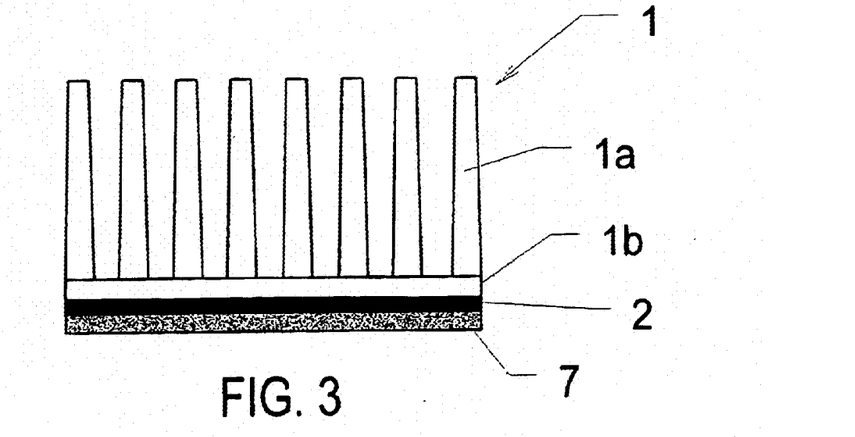
FIG. 3 is a side view of a radiator of a high-frequency current suppressing type according to a third embodiment of this invention.

Referring to FIG. 3, description will be made of a radiator of a high-frequency current suppressing type according to a third embodiment of this invention. Similar parts are designated by like reference numerals and will not be described any longer.

In the radiator 1 illustrated in FIG. 3, the high-frequency current suppressor 2 formed on the lower surface of the base plate 1b is provided with a heat-conductive sheet 7 which is attached to the lower surface of the high-frequency current suppressor 2 and which is excellent in heat conductivity. The heat-conductive sheet 7 is adhered to the high-frequency current suppressor 2 by the use of an adhesive or a double-sided adhesive tape.

With this structure also, the above-mentioned effects are obtained. In addition, because of provision of the heat-conductive sheet 7, heat transfer to the radiator 1 is promoted. Thus, the heat radiation characteristic is improved.

Figure 4:
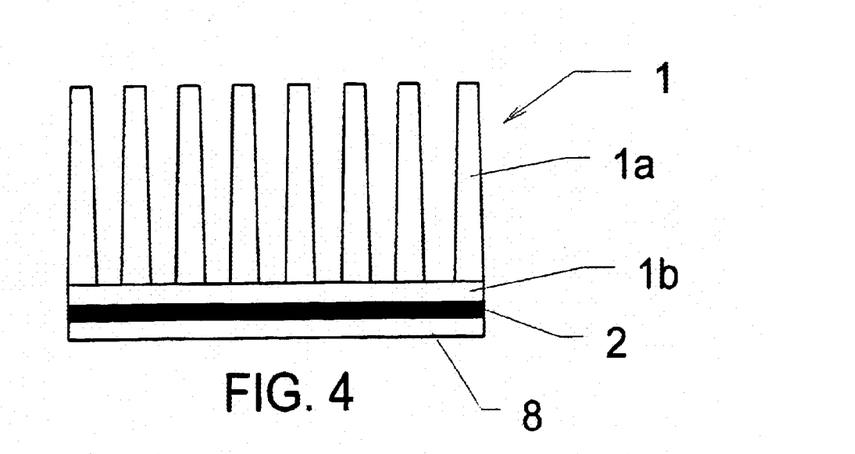
FIG. 4 is a side view of a radiator of a high-frequency current suppressing type according to a fourth embodiment of this invention.

Referring to FIG. 4, description will be made of a radiator of a high-frequency current suppressing type according to a fourth embodiment of this invention. Similar parts are designated by like reference numerals and will not be described any longer.

In the radiator 1 illustrated in FIG. 4, the high-frequency current suppressor 2 formed on the lower surface of the base plate 1b is provided with an insulating sheet 8, such as a polyimide film, which is attached to the lower surface of the high-frequency current suppressor 2 and which is excellent in electrical insulation. The insulating sheet 8 is adhered to the high-frequency current suppressor 2 by the use of an adhesive or a double-sided adhesive tape.

The high-frequency current suppressors 2 and 3 can be formed by sputtering or vapor deposition. In addition to the sputtering or the vapor deposition mentioned above, chemical vapor deposition (CVD), ion beam deposition, gas deposition, and pattern transfer may be used upon forming the high-frequency current suppressors 2 and 3.

Each of the high-frequency current suppressors 2 and 3 is a thin-film magnetic substance having a thickness between 0.3 and 20 $\mu$m and exhibits the conductivity within a frequency range smaller than several tens MHz.

As a material for each of the high-frequency current suppressors 2 and 3, use may be made of a narrow-band magnetic loss material which has an M—X—Y composition as a mixture of components M (M being at least one of Fe, Co, and Ni), Y (Y being at least one of F, N, and O), and X (X being at least one element other than those contained in M and Y) and which has a permeability characteristic, given as a relationship between a frequency and an imaginary part $\mu''$ with respect to a real part $\mu'$ of relative permeability, such that the maximum value $\mu''_{max}$ of the imaginary part $\mu''$ (which may be called a magnetic loss term) is present within a frequency range between 100 MHz and 10 GHz and that a relative bandwidth bwr is not greater than 200% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof. It is assumed here that the narrow-band magnetic loss material has saturation magnetization between 80% and 60% of that of a metal magnetic material comprising the component M alone and a d.c. electric resistance between 100 $\mu\Omega$·cm and 700 $\mu\Omega$·cm.

As the material for each of the high-frequency current suppressors 4a, 4b, and 5, use may also be made of a wide-band magnetic loss material which has an M—X—Y composition as a mixture of components M (M being at least one of Fe, Co, and Ni), Y (Y being at least one of F, N, and O), and X (X being at least one element other than those contained in M and Y) and which has a permeability characteristic, given as a relationship between a frequency and an imaginary part $\mu''$ with respect to a real part $\mu'$ of relative permeability, such that the maximum value $\mu''_{max}$ of the imaginary part $\mu''$ is present within a frequency range between 100 MHz and 10 GHz and that a relative bandwidth bwr is not smaller than 150% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof. It is assumed here that the wide-band magnetic loss material has saturation magnetization between 60% and 35% of that of a metal magnetic material comprising the component M alone and a d.c. electric resistance greater than 500 $\mu\Omega$·cm.

In each of the narrow-band magnetic loss material and the wide-band magnetic loss material used as the high-frequency current suppressors 4a, 4b, and 5, the component X is at least one of C, B, Si, Al, Mg, Ti, Zn, Hf, Sr, Nb, Ta, and rare earth elements. The component M is present in a granular structure where particles or grains of the component M are dispersed in a matrix of a compound of the components X and Y. The particles have an average particle size between 1 nm and 40 nm. The narrow-band or the wide-band magnetic loss material has an anisotropic magnetic field of 47400 A/m or less. Preferably, the M—X—Y composition of the wide-band or the narrow-band magnetic loss material is an Fe—Al—O composition or an Fe—Si—O composition.

In the foregoing, description has been made of the case where the semiconductor integrated circuit device is used as the electronic component. However, this invention is also applicable if the electronic component is a different semiconductor active device including a semiconductor large-scale integrated circuit device, a logic circuit device such as a microprocessor, a central processing unit, and a image processor arithmetic logic unit, or the like.

The radiator may be attached to the circuit board or a housing to which the electronic component is mounted.

In either event, as each of the high-frequency current suppressors 2 and 3, use is made of a thin-film magnetic substance which is small in volume and which is a magnetic loss material having a large imaginary part (i.e., a "magnetic loss term") $\mu''$ of the relative permeability. As a magnetic substance which can be increased in magnetic loss term, a granular magnetic material is known. Specifically, in case where the concentration of magnetic metal particles in the granular magnetic material falls within a particular range, excellent magnetic loss characteristic can be obtained in a high-frequency region.

Next, description will be made as to granular structure and production methods of M—X—Y magnetic composition.

Figure 5:
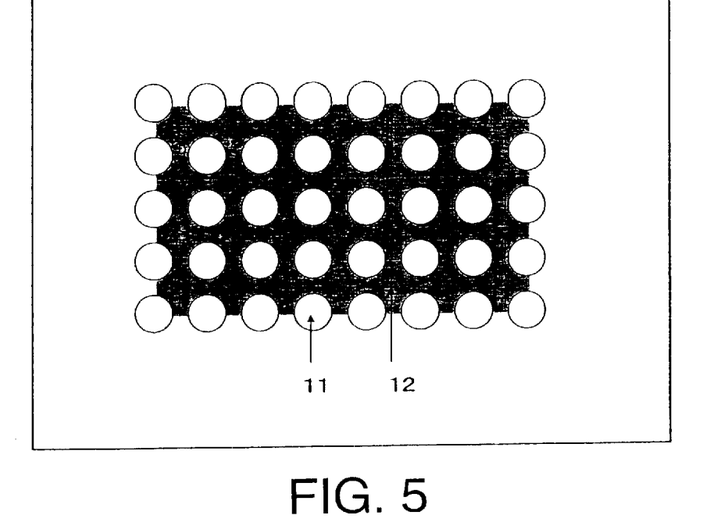
FIG. 5 is a schematic view showing a granular structure of M—X—Y magnetic composition.

Referring to FIG. 5 in which schematically shows the granular structure of M—X—Y magnetic composition, particles 11 of metallic magnetic material M are uniformly or evenly distributed in a matrix 12 consisting of X and Y.

Figure 6A:
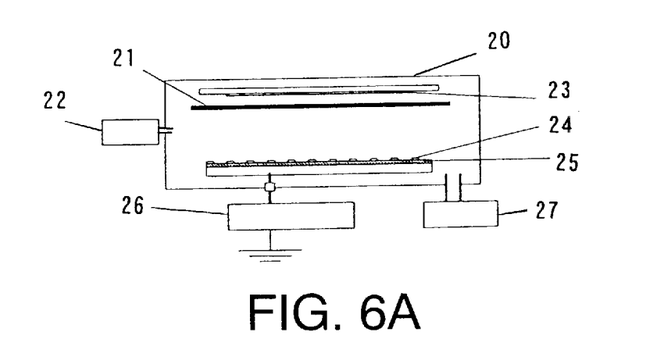
FIG. 6A is a schematic sectional view showing a structure of a sputtering apparatus which was used in examples.

Referring to FIG. 6A, a sputtering apparatus shown therein was used for producing samples in the following examples and comparative examples. The sputtering apparatus has a conventional structure and comprises a vacuum container 20, a shutter 21, an atmospheric gas source 22, a substrate or a glass plate 23, chips 24 (X or X—Y), a target 25 (M), an RF power source, and a vacuum pump 27. The atmospheric gas source 22 and the vacuum pump 27 are connected to the vacuum container 20. The substrate 23 confronts to the target 25 on which chips 24 are disposed. The shutter 21 is disposed in front of the substrate 21. The RF power source 26 is connected to the target 25.

Figure 6B:
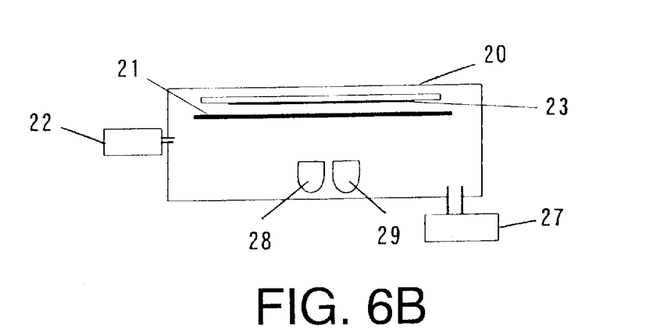
FIG. 6B is a schematic sectional view showing a structure of a vapor deposition apparatus which was used in examples.

Referring to FIG. 6B, a vapor deposition apparatus shown therein was also used as another apparatus for producing samples in the following examples and comparative examples. The vapor deposition apparatus has a conventional structure and has vacuum container 20, atmospheric gas source 22, and vacuum pump 27 similar to the sputtering apparatus but has a crucibles 28 and 29 including materials (X—Y) in place of chips 24, target 25 and RF power source 26.

EXAMPLE 1

A thin film of M—X—Y magnetic composition was made on a glass plate by use of the sputtering apparatus shown in FIG. 6A at a sputtering condition shown in Table 1.

TABLE 1

| | |
|---|---|
| Vacuum degree before sputtering | <1 × 10$^{-6}$ Torr |
| Atmosphere | Ar gas |
| Electric Power | RF |
| Targets | Fe (diameter of 100 mm) and Al$_2$O$_3$ chip (120 pieces) (chip size: 5 mm × 5 mm × 2 mm) |

The film sample 1 produced was analyzed by a fluorescent X-ray spectroscopy and confirmed as a film of a composition Fe$_{72}$Al$_{11}$O$_{17}$. The film sample 1 had 2.0 micrometer ($\mu$m) in thickness, 530 micro ohm centimeters ($\mu\Omega$·cm) in DC specific resistance, 18 Oe in anisotropy field (Hk), and 16,800 Gauss in saturation magnetization (Ms).

A percent ratio of the saturation magnetization of the film sample 1 and that of the metallic material M itself {Ms(M—X—Y)/Ms(M)}×100 was 72.2%.

Figure 7:
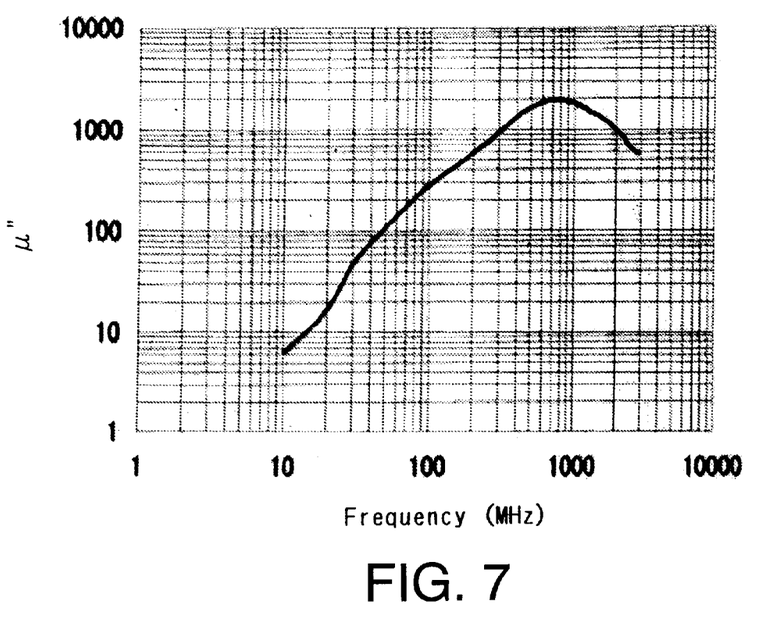
FIG. 7 is a graphical view showing a permeability frequency response of film sample 1 in Example 1.

In order to measure a permeability frequency response, the film sample 1 was formed in a ribbon like form and inserted in a coil. Under application of a bias magnetic field, an impedance variation of the coil was measured in response to frequency change of AC current applied to the coil. The measurement was several times for different values of the bias magnetic field. From the measured impedance variation in response to frequency variation, the permeability frequency response ($\mu$"-f response) was calculated and is shown in FIG. 7. It will be noted from FIG. 7 that the imaginary part of relative permeability has a high peak or the maximum value ($\mu"_{max}$) and rapidly falls either side of the peak. The natural resonance frequency (f($\mu"_{max}$)) showing the maximum value ($\mu"_{max}$) is about 700 MHz. From the $\mu$"-f response, a relative bandwidth bwr was determined as a percentage ratio of bandwidth between two frequency points which shows the imaginary part of relative permeability as a half value $\mu"_{50}$ of the maximum value $\mu"_{max}$, to center frequency of said bandwidth. The relative bandwidth bwr was 148%.

EXAMPLE 2

In a condition similar to that in Example 1 but using of 150 Al$_2$O$_3$ chips, a film sample 2 was formed on a glass plate.

The film sample 2 produced was analyzed by a fluorescent X-ray spectroscopy and confirmed as a film of a composition Fe$_{44}$Al$_{22}$O$_{34}$. The film sample 2 had 1.2 micrometer ($\mu$m) in thickness, 2400 micro ohm centimeters ($\mu\Omega$·cm) in DC specific resistance, 120 Oe in anisotropy field (Hk), and 9600 Gauss in saturation magnetization (Ms). It will be noted that film sample 2 is higher than film sample 1 in the specific resistance.

A percent ratio of the saturation magnetization of the film sample 2 and that of the metallic material M itself {Ms(M—X—Y)/Ms(M)}×100 was 44.5%.

Figure 8:
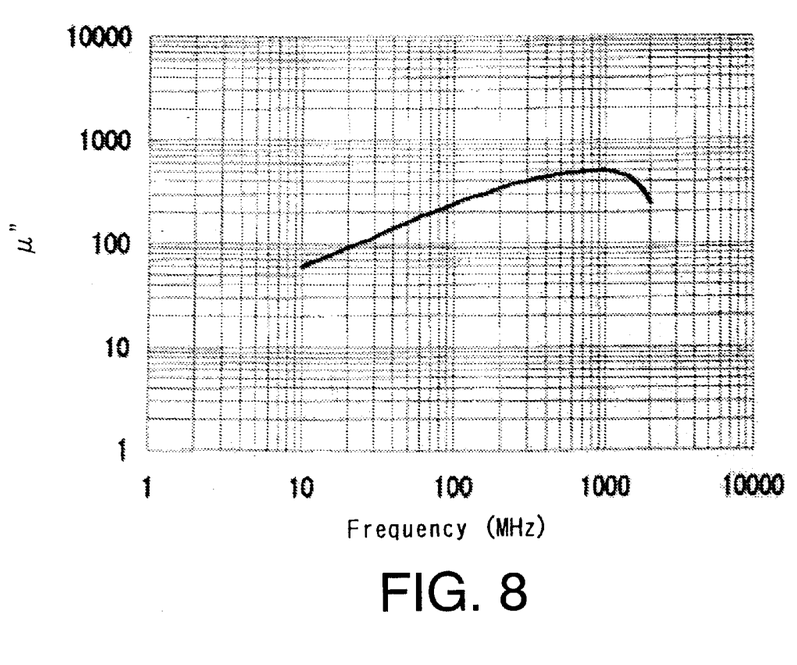
FIG. 8 is a graphical view showing a permeability frequency response of film sample 2 in Example 2.

The $\mu$"-f response of film sample 2 was also obtained in the similar manner as in Example 1 and shows in FIG. 8. It is noted that the peak has also a high value similar to that in film sample 1. However, the frequency point at the peak, or the natural resonance frequency is about 1 GHz and the imaginary part of relative permeability gradually falls either side of the peak so that the $\mu$"-f response has a broadband characteristic.

A relative bandwidth bwr of film sample 2 was also confirmed as 181% by the similar way as in Example 1.

Comparative Example 1

In a condition similar to that in Example 1 but using of 90 Al$_2$O$_3$ chips, a comparative sample 1 was formed on a glass plate.

The comparative sample 1 produced was analyzed by a fluorescent X-ray spectroscopy and confirmed as a film of a composition Fe$_{86}$Al$_6$O$_8$. The comparative sample 1 had 1.2 micrometer ($\mu$m) in thickness, 74 micro ohm centimeters ($\mu\Omega$·cm) in DC specific resistance, 22 Oe in anisotropy field (Hk), 18,800 Gauss in saturation magnetization (Ms), and 85.7% in a percent ratio of the saturation magnetization of the comparative sample 1 and that of the metallic material M itself {Ms(M—X—Y)/Ms(M)}×100, and was 44.5%.

Figure 9:
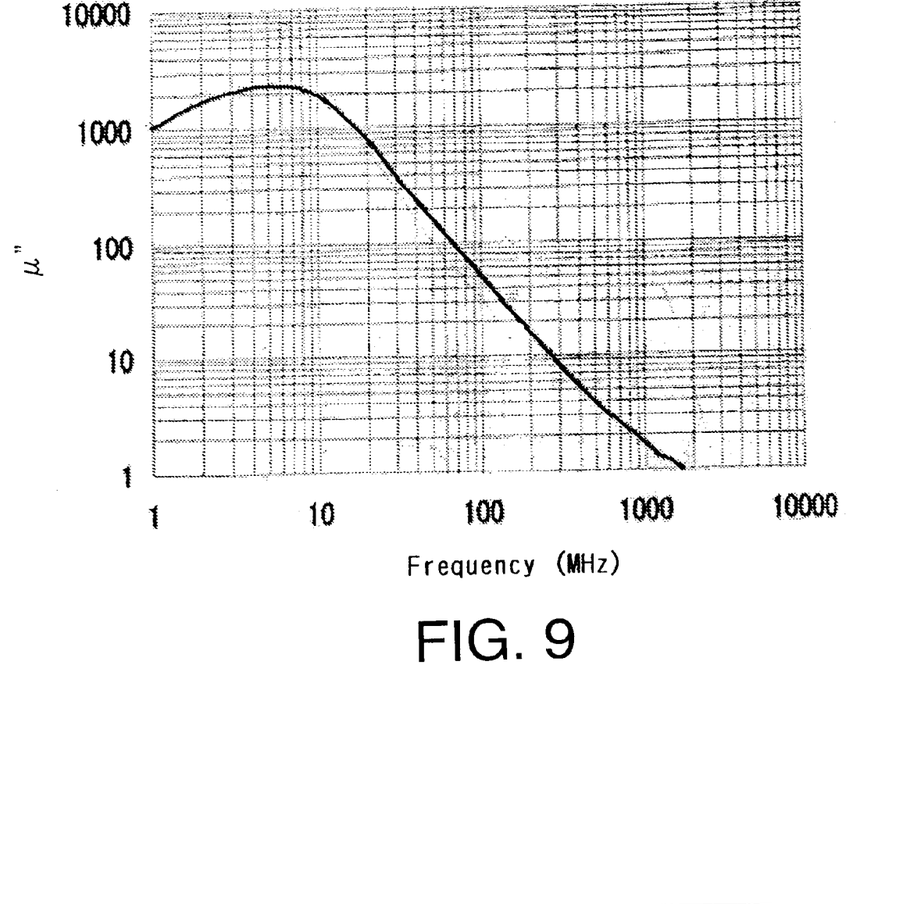
FIG. 9 is a graphical view showing a permeability frequency response of comparable sample 1 in Comparable Example 1.

The $\mu$"-f response of comparative sample 1 was also obtained in the similar manner as in Example 1, and is shown in FIG. 9. It will be noted from FIG. 9 that the imaginary part $\mu$" of relative permeability of the comparative sample 1 has a high peak at a frequency about 10 MHz but rapidly reduces at the higher frequency range than 10 MHz. It can be supposed that this reduction is caused by generation of eddy current due to the lower specific resistance.

Comparative Example 2

In a condition similar to that in Example 1 but using of 200 Al$_2$O$_3$ chips, a comparative sample 2 was formed on a glass plate.

The comparative sample 2 produced was analyzed by a fluorescent X-ray spectroscopy and confirmed as a film of a composition Fe$_{19}$Al$_{34}$O$_{47}$. The comparative sample 2 had 1.3 micrometer ($\mu$m) in thickness, 10,500 micro ohm centimeters ($\mu\Omega$·cm) in DC specific resistance.

The magnetic characteristic of comparative sample 1 exhibited superparamagnetism.

EXAMPLE 4

A thin film of M—X—Y magnetic composition was made on a glass plate by the reactive sputtering method using the sputtering apparatus shown in FIG. 6A at a sputtering condition shown in Table 2. The partial pressure ratio of N$_2$ was 20%. The thin film was heat-treated at a temperature of 300° C. for two hours in vacuum under magnetic field and obtained a film sample 4.

TABLE 2

| | |
|---|---|
| Vacuum degree before sputtering | <1 × 10$^{-6}$ Torr |
| Atmosphere | Ar + N$_2$ gas |
| Electric Power | RF |
| Targets | Fe (diameter of 100 mm) and Al chip (150 pieces) (chip size: 5 mm × 5 mm × 2 mm) |

The properties of film sample 4 are show in Table 3.

TABLE 3

| | |
|---|---|
| Film thickness | 1.5 μm |
| {Ms(M-X-Y)/Ms(M)} × 100 | 51.9% |
| $\mu''_{max}$ | 520 |
| f($\mu''_{max}$) | 830 MHz |
| bwr | 175% |

EXAMPLE 5

A thin film of M—X—Y magnetic composition was made on a glass plate by using the sputtering apparatus shown in FIG. 6A at a sputtering condition shown in Table 4. The thin film was heat-treated at a temperature of 300° C. for two hours in vacuum under magnetic field and obtained a film sample 5.

TABLE 4

| | |
|---|---|
| Vacuum degree before sputtering | <1 × 10⁻⁶ Torr |
| Atmosphere | Ar gas |
| Electric Power | RF |
| Targets | Co (diameter of 100 mm) and |
| | Al₂O₃ chip (130 pieces) |
| | (chip size: 5 mm × 5 mm × 2 mm) |

The properties of film sample 5 are show in Table 5.

TABLE 5

| | |
|---|---|
| Film thickness | 1.1 μm |
| {Ms(M-X-Y)/Ms(M)} × 100 | 64.7% |
| $\mu''_{max}$ | 850 |
| f($\mu''_{max}$) | 800 MHz |
| bwr | 157% |

EXAMPLE 6

A thin film of M—X—Y magnetic composition was made on a glass plate by the reactive sputtering method using the sputtering apparatus shown in FIG. 6A at a sputtering condition shown in Table 6. The partial pressure ratio of N₂ was 10%. The thin film was heat-treated at a temperature of 300° C. for two hours in vacuum under magnetic field and obtained a film sample 6.

TABLE 6

| | |
|---|---|
| Vacuum degree before sputtering | <1 × 10⁻⁶ Torr |
| Atmosphere | Ar + N₂ gas |
| Electric Power | RF |
| Targets | Co (diameter of 100 mm) and |
| | Al chip (170 pieces) |
| | (chip size: 5 mm × 5 mm × 2 mm) |

The properties of film sample 6 are show in Table 7.

TABLE 7

| | |
|---|---|
| Film thickness | 1.2 μm |
| {Ms(M-X-Y)/Ms(M)} × 100 | 32.7% |
| $\mu''_{max}$ | 350 |
| f($\mu''_{max}$) | 1 GHz |
| bwr | 191% |

EXAMPLE 7

A thin film of M—X—Y magnetic composition was made on a glass plate by using the sputtering apparatus shown in FIG. 6A at a sputtering condition shown in Table 8. The thin film was heat-treated at a temperature of 300° C. for two hours in vacuum under magnetic field and obtained a film sample 7.

TABLE 8

| | |
|---|---|
| Vacuum degree before sputtering | <1 × 10⁻⁶ Torr |
| Atmosphere | Ar gas |
| Electric Power | RF |
| Targets | Ni (diameter of 100 mm) and |
| | Al₂O₃ chip (140 pieces) |
| | (chip size: 5 mm × 5 mm × 2 mm) |

The properties of film sample 4 are show in Table 9.

TABLE 9

| | |
|---|---|
| Film thickness | 1.7 μm |
| {Ms(M-X-Y)/Ms(M)} × 100 | 58.2% |
| $\mu''_{max}$ | 280 |
| f($\mu''_{max}$) | 240 MHz |
| bwr | 169% |

EXAMPLE 8

A thin film of M—X—Y magnetic composition was made on a glass plate by the reactive sputtering method using the sputtering apparatus shown in FIG. 6A at a sputtering condition shown in Table 10. The partial pressure ratio of N₂ was 10%. The thin film was heat-treated at a temperature of 300° C. for two hours in vacuum under magnetic field and obtained a film sample 8.

TABLE 10

| | |
|---|---|
| Vacuum degree before sputtering | <1 × 10⁻⁶ Torr |
| Atmosphere | Ar + N₂ gas |
| Electric Power | RF |
| Targets | Ni (diameter of 100 mm) and |
| | Al chip (100 pieces) |
| | (chip size: 5 mm × 5 mm × 2 mm) |

The properties of film sample 10 are show in Table 11.

TABLE 11

| | |
|---|---|
| Film thickness | 1.3 μm |
| {Ms(M-X-Y)/Ms(M)} × 100 | 76.2% |
| $\mu''_{max}$ | 410 |
| f($\mu''_{max}$) | 170 MHz |
| bwr | 158% |

EXAMPLE 9

A thin film of M—X—Y magnetic composition was made on a glass plate by using the sputtering apparatus shown in FIG. 6A at a sputtering condition shown in Table 12. The thin film was heat-treated at a temperature of 300° C. for two hours in vacuum under magnetic field and obtained a film sample 9.

TABLE 12

| | |
|---|---|
| Vacuum degree before sputtering | <1 × 10⁻⁶ Torr |
| Atmosphere | Ar gas |
| Electric Power | RF |
| Targets | Fe (diameter of 100 mm) and |
| | TiO₂ chip (150 pieces) |
| | (chip size: 5 mm × 5 mm × 2 mm) |

The properties of film sample 9 are show in Table 13.

TABLE 13

| | |
|---|---|
| Film thickness | 1.4 μm |
| {Ms(M-X-Y)/Ms(M)} × 100 | 43.6% |
| $\mu''_{max}$ | 920 |
| $f(\mu''_{max})$ | 1.5 GHz |
| bwr | 188% |

EXAMPLE 10

A thin film of M—X—Y magnetic composition was made on a glass plate by the reactive sputtering method using the sputtering apparatus shown in FIG. 6A at a sputtering condition shown in Table 14. The partial pressure ratio of $O_2$ was 15%. The thin film was heat-treated at a temperature of 300° C. for two hours in vacuum under magnetic field and obtained a film sample 10.

TABLE 14

| | |
|---|---|
| Vacuum degree before sputtering | <1 × 10⁻⁶ Torr |
| Atmosphere | Ar + $O_2$ gas |
| Electric Power | RF |
| Targets | Fe (diameter of 100 mm) and Si chip (130 pieces) (chip size: 5 mm × 5 mm × 2 mm) |

The properties of film sample 10 are show in Table 15.

TABLE 15

| | |
|---|---|
| Film thickness | 1.5 μm |
| {Ms(M-X-Y)/Ms(M)} × 100 | 55.2% |
| $\mu''_{max}$ | 920 |
| $f(\mu''_{max})$ | 1.2 GHz |
| bwr | 182% |

EXAMPLE 11

A thin film of M—X—Y magnetic composition was made on a glass plate by using the sputtering apparatus shown in FIG. 6A at a sputtering condition shown in Table 16. The thin film was heat-treated at a temperature of 300° C. for two hours in vacuum under magnetic field and obtained a film sample 11.

TABLE 16

| | |
|---|---|
| Vacuum degree before sputtering | <1 × 10⁻⁶ Torr |
| Atmosphere | Ar gas |
| Electric Power | RF |
| Targets | Fe (diameter of 100 mm) and $HfO_3$ chip (100 pieces) (chip size: 5 mm × 5 mm × 2 mm) |

The properties of film sample 11 are show in Table 17.

TABLE 17

| | |
|---|---|
| Film thickness | 1.8 μm |
| {Ms(M-X-Y)/Ms(M)} × 100 | 77.4% |
| $\mu''_{max}$ | 1800 |
| $f(\mu''_{max})$ | 450 MHz |
| bwr | 171% |

EXAMPLE 12

A thin film of M—X—Y magnetic composition was made on a glass plate by using the sputtering apparatus shown in FIG. 6A at a sputtering condition shown in Table 18. The thin film was heat-treated at a temperature of 300° C. for two hours in vacuum under magnetic field and obtained a film sample 12.

TABLE 18

| | |
|---|---|
| Vacuum degree before sputtering | <1 × 10⁻⁶ Torr |
| Atmosphere | Ar gas |
| Electric Power | RF |
| Targets | Fe (diameter of 100 mm) and BN chip (130 pieces) (chip size: 5 mm × 5 mm × 2 mm) |

The properties of film sample 12 are show in Table 19.

TABLE 19

| | |
|---|---|
| Film thickness | 1.9 μm |
| {Ms(M-X-Y)/Ms(M)} × 100 | 59.3% |
| $\mu''_{max}$ | 950 |
| $f(\mu''_{max})$ | 680 MHz |
| bwr | 185% |

EXAMPLE 13

A thin film of M—X—Y magnetic composition was made on a glass plate by using the sputtering apparatus shown in FIG. 6A at a sputtering condition shown in Table 20. The thin film was heat-treated at a temperature of 300° C. for two hours in vacuum under magnetic field and obtained a film sample 13.

TABLE 20

| | |
|---|---|
| Vacuum degree before sputtering | <1 × 10⁻⁶ Torr |
| Atmosphere | Ar gas |
| Electric Power | RF |
| Targets | $Fe_{50}Co_{50}$ (diameter of 100 mm) and $Al_2O_3$ chip (130 pieces) (chip size: 5 mm × 5 mm × 2 mm) |

The properties of film sample 13 are show in Table 21.

TABLE 21

| | |
|---|---|
| Film thickness | 1.6 μm |
| {Ms(M-X-Y)/Ms(M)} × 100 | 59.3% |
| $\mu''_{max}$ | 720 |
| $f(\mu''_{max})$ | 1.1 GHz |
| bwr | 180% |

EXAMPLE 14

A thin film of M—X—Y magnetic composition was made on a glass plate by using the vapor deposition apparatus shown in FIG. 6B at a condition shown in Table 22. The thin film was heat-treated at a temperature of 300° C. for two hours in vacuum under magnetic field and obtained a film sample 14.

TABLE 22

| | |
|---|---|
| Vacuum degree before sputtering | <1 × 10⁻⁶ Torr |
| Atmosphere flowing rate | $O_2$ at 3.0 sccm |
| Elements in crucible 28 and 29 | Fe and Al |

The properties of film sample 14 are show in Table 23.

TABLE 23

| | |
|---|---|
| Film thickness | 1.1 μm |
| {Ms(M-X-Y)/Ms(M)} × 100 | 41.8% |
| $\mu''_{max}$ | 590 |
| f($\mu''_{max}$) | 520 MHz |
| bwr | 190% |

Now, description will be made as to tests relating to noise suppressing effect of sample films and comparative samples, using a test apparatus shown in FIG. 10.

A test piece was film sample 1 with dimensions of 20 mm×20 mm×2.0 μm. For a comparison, a sheet of known composite magnetic material having dimensions of 20 mm×20 mm×1.0 mm. The composite magnetic material comprising polymer and flat magnetic metal powder dispersed in the polymer. The magnetic metal powder comprises Fe, Al and Si. The composite magnetic material has a permeability distribution in quasi-microwave range and has the maximum value of the imaginary part of relative permeability at a frequency about 700 MHz. Table 24 shows magnetic properties of both of the test piece and comparative test piece.

TABLE 24

| | Film sample 1 | Comparative test piece |
|---|---|---|
| $\mu''$/700 MHz | about 1800 | about 3.0 |
| bwr | 148 | 1196 |

As seen from Table 24, the film sample 1 is about 600 times more than comparative test piece in the maximum value of the imaginary part of relative permeability. Since the noise suppressing effect is generally evaluated from a value of a product ($\mu''_{max} \times \delta$) of the maximum value $\mu''_{max}$ of the imaginary part of relative permeability and thickness of the piece δ, the thickness of the comparative test piece of the composite magnetic material sheet was selected 1 mm so that the both of test pieces have the similar values of ($\mu''_{max} \times \delta$).

Figure 10:
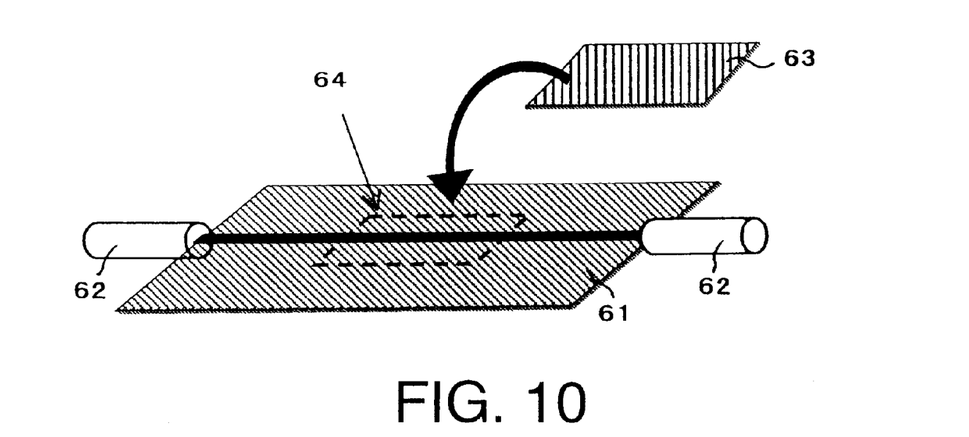
FIG. 10 is a schematic and perspective view of a test apparatus for testing a noise suppressing effect of magnetic samples.

Referring to FIG. 10, the test apparatus comprises a micro-strip line 61 having two ports, coaxial cables 62 connected to the two ports, and a network analyzer (not shown) connected across the two ports. The micro-strip line 61 has a line length of 75 mm and a characteristic impedance of 50 ohms. The test piece 63 was disposed at a region 64 on the micro-strip line 61 and the transmission characteristic S21 was measured. The frequency response of S21 are shown in FIGS. 11A and 11B for film sample 1 and the comparative sample, respectively.

Figure 11A:
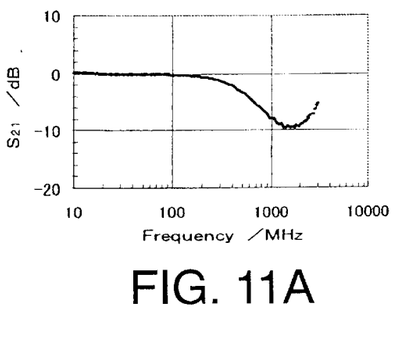
FIG. 11A is a graphic view showing a transmission characteristic of film sample 1.
Figure 11B:
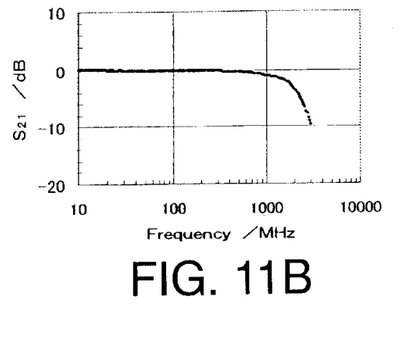
FIG. 11B is a graphic view showing a transmission characteristic of comparable sample of composite magnetic material sheet.

With respect to use of film sample 1, it will be noted from FIG. 11A that S21 reduces above 100 MHz, becomes to the minimum of −10 dB at a frequency of 2 GHz and then increases above 2 GHz. On the other hand, with respect to use of comparative sample, it will be noted from FIG. 11B that S21 gradually reduces and becomes to the minimum of −10 dB at a frequency of 3 GHz.

The results demonstrate that S21 is dependent on the frequency distribution of the permeability and that the noise suppressing effect is dependent on the product of ($\mu''_{max} \times \delta$).

Figure 12A:
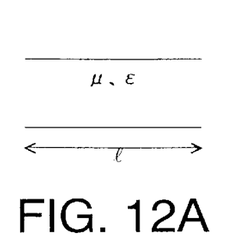
FIG. 12A is a distribution constant circuit with a length l showing a magnetic material as a noise suppressor.
Figure 12B:
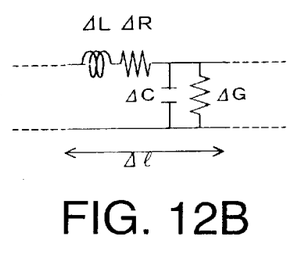
FIG. 12B is an equivalent circuit with a unit length Δl of the distribution constant circuit of FIG. 12A.
Figure 12C:
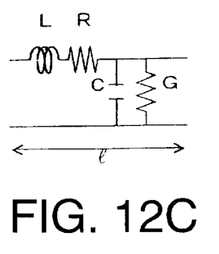
FIG. 12C is an equivalent circuit with a length l of the distribution constant circuit of FIG. 12A.

Now, providing that the magnetic sample forms a distribution constant circuit having a length of l as shown in FIG. 12A, an equivalent circuit was calculated for a unit length of Δl from transmission characteristics S11 and S21, as shown in FIG. 12B. Then, the equivalent circuit for the length l was obtained from the equivalent circuit for the unit length Δl, as shown in FIG. 12C. The equivalent circuit of the magnetic sample comprises series inductance L and resistance R and parallel capacitance C and conductance G, as shown in FIG. 12C. From this, it will be understood that the change of transmission characteristic of the micro-strip line caused due to disposition of the magnetic substance on the micro-strip line is mainly determined by the equivalent resistance R added in series.

Figure 13A:
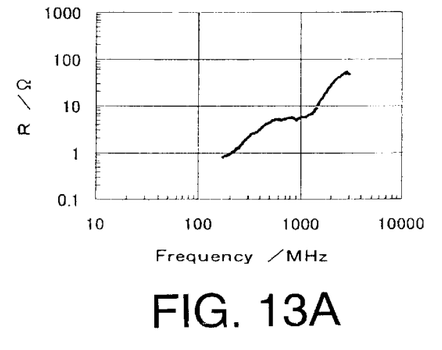
FIG. 13A is a graphic view showing a frequency response of an equivalent resistance R of film sample 1 in Example 1.
Figure 13B:
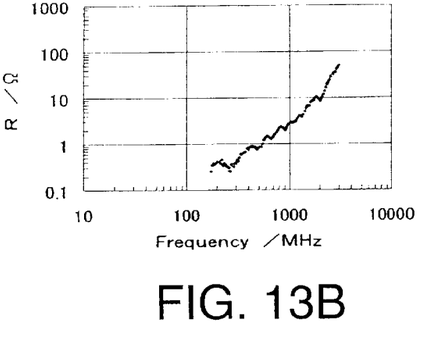
FIG. 13B is a graphic view showing a frequency response of an equivalent resistance R of comparative sample of a composite magnetic material sheet.

In view of the above, a frequency response of the equivalent resistance R was measured. The measured data were shown in FIGS. 13A and 13B for the film sample 1 and the comparative sample, respectively. It will be noted from these figures that the equivalent resistance R gradually reduces in the quasi-microwave range and is about 60 ohms at about 3 GHz. It is seen that the frequency dependency of the equivalent resistance R is different from that of the imaginary part of relative permeability which has the maximum value at about 1 GHz. It will be supposed that this difference will be based on the gradual increase of a ratio of the product and the sample length to the wavelength.

What is claimed is:

1. A radiator for use in radiating heat generated by an electronic component, said radiator having a principal surface facing said electronic component, said radiator comprising a high-frequency current suppressor attached to said principal surface for attenuating a high-frequency current flowing through said radiator and having a frequency within a frequency band between several tens of MHz and several GHz, wherein said high-frequency current suppressor is a thin-film magnetic substance.

2. A radiator as claimed in claim 1, further comprising:
a base plate having said principal surface and an opposite surface opposite to said principal surface; and
a plurality of fins standing up from said opposite surface to have a predetermined space from one another, said fins being formed integral with said base plate.

3. A radiator as claimed in claim 1, wherein said high-frequency current suppressor is deposited on said principal surface by sputtering.

4. A radiator as claimed in claim 1, wherein said high-frequency current suppressor is deposited on said principal surface by vapor deposition.

5. A radiator as claimed in claim 1, wherein said electronic component is a semiconductor active device used in a high frequency band and operable at a high speed, said electronic component including one of a semiconductor integrated circuit device, a semiconductor large-scale integrated circuit device, and a logic circuit device.

6. A radiator as claimed in claim 1, further comprising a double-sided adhesive tape arranged for use in adhesion.

7. A radiator as claimed in claims 1, wherein said high-frequency current suppressor has a thickness between 0.3 μm and 20 μm.

8. The radiator as claimed in claim 1, said radiator further comprising an insulating sheet excelling in electrical insulation and formed on said high-frequency current suppressor.

9. The radiator as claimed in claim 1, said radiator further comprising a heat-conductive sheet excellent in heat conductivity and formed on said high-frequency current suppressor.

10. A radiator for use in radiating heat generated by an electronic component, said radiator having a principal surface facing said electronic component, said radiator comprising a high-frequency current suppressor attached to said principal surface for attenuating a high-frequency current flowing through said radiator and having a frequency within a frequency band between several tens of MHz and several GHz, said high-frequency current suppressor being made of a magnetic substance of a magnetic composition comprising M, X and Y, wherein M is a metallic magnetic material selected from the group consisting of Fe, Co, Ni and combinations thereof, X being an element or elements other than M and Y, and Y selected from the group consisting of F, N, and O and combinations thereof, said M—X—Y magnetic composition having a concentration of M in the composition so that said M—X—Y magnetic composition has a saturation magnetization of 35–80% of that of the metallic bulk of magnetic material comprising M alone, said magnetic composition having the maximum value $\mu''_{max}$ of an imaginary part $\mu''$ of relative permeability in a frequency range of 0.1–10 gigahertz (GHz).

11. A radiator as claimed in claim 10, wherein the M—X—Y composition is an Fe—Si—O composition.

12. A radiator as claimed in claim 10, wherein said magnetic substance having saturation magnetization between 80% and 60% of that of a metal magnetic material comprising the component M alone.

13. A radiator as claimed in claim 10, wherein said magnetic substance having a d.c. electric resistance between 100 $\mu\Omega$·cm and 700 $\mu\Omega$·cm.

14. A radiator as claimed in claim 10, which has a permeability frequency response of a relatively broad band where a relative bandwidth bwr is 150% or more, said relative bandwidth bwr is determined as a percentage ratio of bandwidth between two frequency points which shows the imaginary part of relative permeability as a half value $\mu''_{50}$ of the maximum value $\mu''_{max}$, to center frequency of said bandwidth.

15. A radiator as claimed in claim 14, wherein said magnetic substance having saturation magnetization between 60% and 35% of that of a metal magnetic material comprising the component M alone.

16. A radiator as claimed in claim 14, wherein said magnetic substance having a d.c. electric resistance greater than 500 $\mu\Omega$·cm.

17. A radiator as claimed in claim 10, wherein the component X of said magnetic substance is at least one selected from C, B, Si, Al, Mg, Ti, Zn, Hf, Sr, Nb, Ta, and rare earth elements.

18. A radiator as claimed in claim 10, wherein the component M of said magnetic substance is present in a granular structure where particles or grains of the component M are dispersed in a matrix of a compound of the components X and Y.

19. A radiator as claimed in claim 18, wherein said magnetic substance is formed so that said particles in the granular structure have an average particle size between 1 nm and 40 nm.

20. A radiator as claimed in claim 10, wherein said magnetic substance has an anisotropic magnetic field of 47400 A/m or less.

21. A radiator as claimed in claim 10, wherein the M—X—Y composition is an Fe—Al—O composition.

* * * * *